(12) United States Patent
Guo et al.

(10) Patent No.: US 6,979,586 B2
(45) Date of Patent: Dec. 27, 2005

(54) MAGNETIC RANDOM ACCESS MEMORY ARRAY WITH COUPLED SOFT ADJACENT MAGNETIC LAYER

(75) Inventors: Yimin Guo, San Jose, CA (US); Tai Min, Milpitas, CA (US); Pokang Wang, San Jose, CA (US); Xi Zeng Shi, Fremont, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 3 days.

(21) Appl. No.: 10/872,915

(22) Filed: Jun. 21, 2004

(65) Prior Publication Data

US 2004/0233760 A1 Nov. 25, 2004

(51) Int. Cl.[7] .............................................. H01L 21/00
(52) U.S. Cl. ............................ 438/48; 438/3; 438/70; 257/295; 257/421; 257/422
(58) Field of Search .............................. 257/421, 422, 257/295; 438/3, 48, 70

(56) References Cited

U.S. PATENT DOCUMENTS

| | | | |
|---|---|---|---|
| 5,650,958 A | 7/1997 | Gallagher et al. | 365/173 |
| 5,966,323 A | 10/1999 | Chen et al. | 365/158 |
| 5,969,978 A * | 10/1999 | Prinz | 365/98 |
| 6,005,800 A * | 12/1999 | Koch et al. | 365/173 |
| 6,166,948 A | 12/2000 | Parkin et al. | 365/173 |
| 6,211,090 B1 | 4/2001 | Durlam et al. | 438/692 |
| 6,531,723 B1 | 3/2003 | Engel et al. | 257/200 |
| 6,611,405 B1 | 8/2003 | Inomata et al. | 360/324.2 |

* cited by examiner

*Primary Examiner*—Christian Wilson
*Assistant Examiner*—Douglas Menz
(74) *Attorney, Agent, or Firm*—George D. Saile; Stephen B. Ackerman

(57) ABSTRACT

An MTJ element is formed between orthogonal word and bit lines. The bit line is a composite line which includes a high conductivity layer and a soft magnetic layer under the high conductivity layer. During operation, the soft magnetic layer concentrates the magnetic field of the current and, due to its proximity to the free layer, it magnetically couples with the free layer in the MTJ. This coupling provides thermal stability to the free layer magnetization and ease of switching and the coupling may be further enhanced by inducing a shape or crystalline anisotropy into the free layer during formation.

10 Claims, 1 Drawing Sheet

MAGNETIC RANDOM ACCESS MEMORY ARRAY WITH COUPLED SOFT ADJACENT MAGNETIC LAYER

BACKGROUND OF THE INVENTION

1. Field of the Invention

This invention relates to the design and fabrication of magnetic tunnel junctions (MTJ) as memory storage devices, particularly to a design wherein a soft-magnetic adjacent layer is included as part of a composite bit line.

2. Description of the Related Art

The magnetic tunnel junction (MTJ) basically comprises two electrodes, which are layers of ferromagnetic material, separated by a tunnel barrier layer, which is a thin layer of insulating material. The tunnel barrier layer must be sufficiently thin so that there is a probability for charge carriers (typically electrons) to cross the layer by means of quantum mechanical tunneling. The tunneling probability is spin dependent, however, depending on the availability of tunneling states with different electron spin orientations. Thus, the overall tunneling current will depend on the number of spin-up vs. spin-down electrons, which in turn depends on the orientation of the electron spin relative to the magnetization direction of the ferromagnetic layers. Thus, if these magnetization directions are varied for a given applied voltage, the tunneling current will also vary as a function of the relative directions. As a result of the behavior of an MTJ, sensing the change of tunneling current for a fixed potential can enable a determination of the relative magnetization directions of the two ferromagnetic layers that comprise it. Equivalently, the resistance of the MTJ can be measured, since different relative magnetization directions will produce different resistances.

The use of an MTJ as an information storage device requires that the magnetization of at least one of its ferromagnetic layers can be varied relative to the other and also that changes in the relative directions can be sensed by means of variations in the tunneling current or, equivalently, the junction resistance. In its simplest form as a two state memory storage device, the MTJ need only be capable of having its magnetizations put into parallel (low resistance) or antiparallel (high resistance) configurations (writing data) and that these two configurations can be sensed by tunneling current variations or resistance variations (reading data). In practice, the free ferromagnetic layer can be modeled as having a magnetization which is free to rotate but which energetically prefers to align in either direction along its easy axis (the direction of magnetic crystalline anisotropy). The magnetization of the fixed layer may be thought of as being permanently aligned in its easy axis direction. When the free layer is anti-aligned with the fixed layer, the junction will have its maximum resistance, when the free layer is aligned with the fixed layer, the minimum resistance is present. In typical MRAM circuitry, the MTJ devices are located at the intersection of current carrying lines called word lines and bit lines. When both lines are activated, the device is written upon, ie, the magnetization direction of its free layer is changed. When only one line is activated, the resistance of the device can be sensed, so the device is effectively read. Such an MTJ device is provided by Gallagher et al. (U.S. Pat. No. 5,650,958), who teach the formation of an MTJ device with a pinned ferromagnetic layer whose magnetization is in the plane of the layer but not free to rotate, together with a free magnetic layer whose magnetization is free to rotate relative to that of the pinned layer, wherein the two layers are separated by an insulating tunnel barrier layer.

In order for the MTJ MRAM device to be competitive with other forms of DRAM, it is necessary that the MTJ be made very small, typically of sub-micron dimension. Parkin et al. (U.S. Pat. No. 6,166,948) teaches the formation of an MTJ MRAM cell in which the free layer is formed of two antiparallel magnetized layers separated by a spacer layer chosen to prevent exchange coupling but to allow direct dipole coupling between the layers. The free layer thereby has closed flux loops and the two layers switch their magnetizations simultaneously during switching operations. Parkin notes that sub-micron dimensions are needed to be competitive with DRAM memories in the range of 10–100 Mbit capacities. Parkin also notes that such small sizes are associated with significant problems, particularly super-paramagnetism, which is the spontaneous thermal fluctuation of magnetization in samples of ferromagnetic material too small to have sufficient magnetic anisotropy (a measure of the ability of a sample to maintain a given magnetization direction). To overcome the undesirable spontaneous thermal fluctuations in MRAM cells with very small cross-sectional areas, it is necessary to make the magnetic layers thick. Unfortunately, the size of the switching field increases with layer thickness, so the price paid for a thermally stable cell is the necessity of expending a great deal of current to change the magnetic orientation of the cell's free layer.

Some degree of anisotropy is necessary if an MTJ cell is to be capable of maintaining a magnetization direction and, thereby, to effectively store data even when write currents are zero. As cell sizes have continued to decrease, the technology has sought to provide a degree of magnetic anisotropy by forming cells in a wide variety of shapes (eg. rectangles, diamonds, ellipses, etc.), so that the lack of inherent crystalline anisotropy is countered by a shape anisotropy. Yet this form of anisotropy brings with it its own problems. A particularly troublesome shape-related problem in MTJ devices results from non-uniform and uncontrollable edge-fields produced by shape anisotropy (a property of non-circular samples). As the cell size decreases, these edge fields become relatively more important than the magnetization of the body of the cell and have an adverse effect on the storage and reading of data. Although such shape anisotropies, when of sufficient magnitude, reduce the disadvantageous effects of super-paramagnetism, they have the negative effect of requiring high currents to change the magnetization direction of the MTJ for the purpose of storing data.

Chen et al. (U.S. Pat. No. 5,966,323) teaches a MTJ MRAM cell that can be switched with a low applied field by forming magnetic layers coupled in antiparallel directions so that the cell, as a whole, has no magnetic moment.

Inomata et al. (U.S. Pat. No. 6,611,405 B1) provide a multi-layer, multi-tunnel junction MRAM device in which a current of spin-polarized electrons flows through the device while bit and word lines also carry current. The arrangement allows an easier reorientation of the magnetic moments with lower currents.

Engel et al. (U.S. Pat. No. 6,531,723 B1) teach the formation of an MRAM cell in which the free layer is a multi-layered laminate of antiferromagnetically coupled layers. Increasing the number of layers in the laminate increases the magnetic switching volume of the cell so that the energy barrier that must be exceeded in order to inadvertently switch the magnetization direction is increased.

Another way to address the problem that high currents are needed to change the magnetization direction of a free layer when the shape anisotropy is high, is to provide a mechanism for concentrating the fields produced by lower current values. This approach was taken by Durlam et al. (U.S. Pat. No. 6,211,090 B1) who teach the formation of a flux concentrator, which is a soft magnetic (NiFe) layer formed around a copper damascene current carrying line. The layer is formed around three sides of the copper line which forms the digit line at the underside of the MRAM cell.

This invention addresses the problem of the high current required to reorient the magnetization of the free layer in ultra-small MRAM cells wherein the super-paramagnetic behavior requires thick free layers. It does so by forming a composite bit line with an adjacent soft magnetic layer that concentrates the magnetic field at the free layer.

SUMMARY OF THE INVENTION

A first object of this invention is to provide an MTJ MRAM cell and an array of such cells, which is thermally stable against fluctuations of the magnetization of the free layer.

A second object of this invention is to provide such an MRAM cell and array of such cells, in which the switching current is not excessive.

A third object of this invention is to provide an MRAM cell in which thermal stability can be achieved with a circular or low aspect ratio elliptical cross-section, the patterning of such shapes being easier to scale and less subject to shape variation and consequent uncontrollable shape anisotropies.

These objects will be achieved by a novel MRAM cell design in which the write current for switching is reduced while the thermal stability is increased by the formation of a composite bit line of a high conductivity material and a thin, soft-magnetic adjacent layer (SAL). By placing the bit line proximal to the free layer, allows the SAL to magnetostatically couple to the free layer. Within the parameters of this design both the free and pinned layers can be a single ferromagnetic layer or a synthetic ferrimagnetic layer. The additional SAL is formed on the bit line and is patterned with it. The soft magnetic material of the SAL can be Ni, Fe, Co and their alloys, while the conducting material can be high conductivity materials such as Cu, Au, Al, Ag, CuAg, Ta, Cr, NiCr, NiFeCr, Ru, Rh and their multi-layers and alloys. The switching current flows substantially through the high conductivity material, so the SAL can be made very thin.

The SAL concentrates the magnetic field produced by the current in the bit line and the proximity of the SAL to the free layer makes the enhanced field extremely effective in switching as a result of magnetostatic coupling between the SAL and the free layer. As is seen in schematic FIG. 1, the magnetization (30) of the SAL beneath a particular circular MRAM cell (10) tends to line up along the bit line (20) current direction (40) when the write current in the bit line is in the direction of the solid arrows (x-direction). The magnetization of the cell free layer (60) (shown displaced from its position above the bit line for clarity) is perpendicular to the bit line (y-direction). The cell has no shape anisotropy because of its circular cross-section, but there is an interaction anisotropy due to magnetostatic interaction with the SAL beneath the cell. This interaction anisotropy is controlled by $M_s t$ (product of magnetic moment and thickness) of the free layer and the SAL and the spacing between them. This interaction anisotropy can be precisely controlled by the fabrication process. During the writing process (current in the word line) the word line write current generates a magnetic field in the direction of the bit line (+x) which will line up the magnetization of the SAL under the free layer in that same direction. The magnetization of the SAL will rotate the magnetization of the free layer towards the +x direction, weakening the interaction anisotropy. Then a small bit line current will rotate the magnetizations of the SAL and free layer in opposite directions, since they are respectively below and above the current. Removing the word line write current and then the bit line current in sequence will leave the magnetizations of the free layer and SAL layer coupled by their mutual dipole interaction with the magnetization of the free layer controlled by the direction of the bit line current. To help maintain the free layer magnetization in the y direction, it can be useful to induce a small amount of anisotropy into the cell during fabrication (during free layer deposition and annealing or by giving the cell a slight elongation in the y-direction). Using the dipole-dipole interaction as a model for the magnetostatic coupling between the free layer and the SAL, it can be shown that the interaction anisotropy, $K_{in}$, is proportional to:

$$K_{in} \propto M_s(SAL) \times M_s(\text{free}) \times t_{SAL} \times a^2 \times r^{-3}$$

where a is the diameter of the cell, r is the distance between the free layer and the cell, and $M_s$ is the magnetic moment. The extreme sensitivity to r (inverse third power) shows that the bit line needs to be thin and close to the free layer. Also, because it is the bit line current that is responsible for the switching, the current must be substantially in the highly conductive bit line layer. If it is desired to reduce the interaction anisotropy, the deposition process induced anisotropy and/or the shape induced anisotropy can be set along the bit line direction (x), since these anisotropies subtract from the interaction anisotropy. Finally, an alternative design to enhance the word line write current field efficiency would be to add a magnetic cladding layer over the word line on the side away from the cell.

DESCRIPTION OF THE PREFERRED EMBODIMENT

The preferred embodiment of the present invention teaches a method of forming an MTJ MRAM cell of substantially circular cross-section or an MRAM array of such cells, in which the required switching current in the bit line can be reduced by the addition of a thin adjacent soft magnetic layer beneath the bit line which couples magnetostatically to a proximal free layer.

Figure 2:
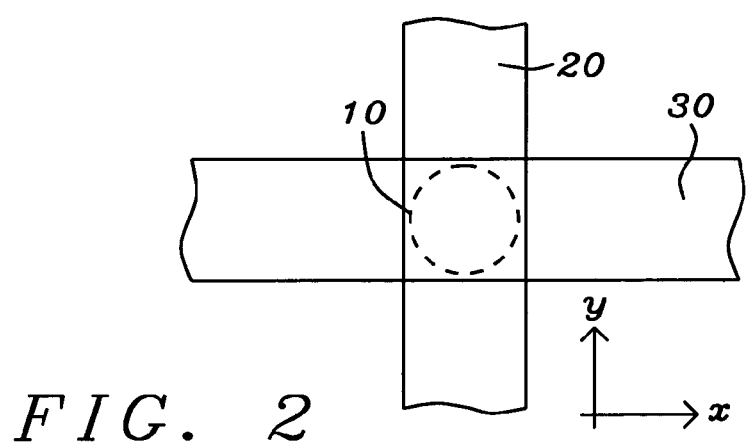
FIG. 2 shows, schematically, an overhead view of the MRAM cell between crossed word and bit lines, illustrating its substantially circular cross-section.

Referring first to FIG. 2 there is shown in a schematic overhead view in the xy-plane, the general layout of the MRAM cell of the present invention. The MTJ element (10), of substantially circular or low aspect ratio (<2) elliptical cross section, is situated at a junction between a write word line (20), which is above the cell and runs in the y-direction, and a bit line (30), which is below the cell and runs in a direction perpendicular to the write word line (the x-direction). The combination of the MTJ element and the write word and bit lines which access and switch the cell form an MTJ MRAM cell. As will be shown in the next figure, a soft magnetic layer is formed on the bottom surface of the bit line and, therefore, cannot be seen in this overhead view. The free layer within the cell is proximal to the bit line.

Figure 1:
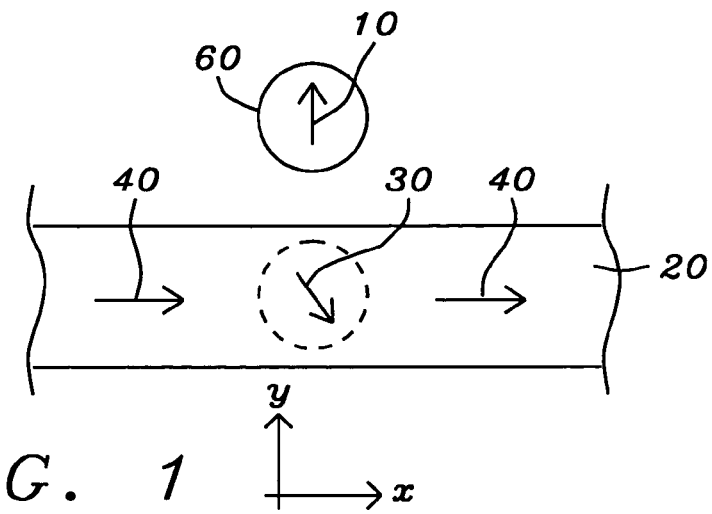
FIG. 1 shows, schematically, the magnetic field in the free layer and in the portion of the SAL just beneath the free layer.
Figure 3:
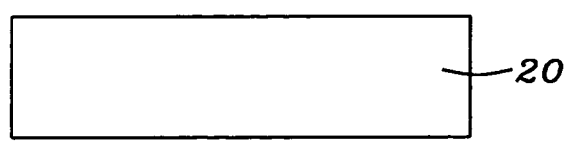
FIG. 3 shows, schematically, a vertical cross-section of the MRAM cell, bit and word lines.
Figure 3:
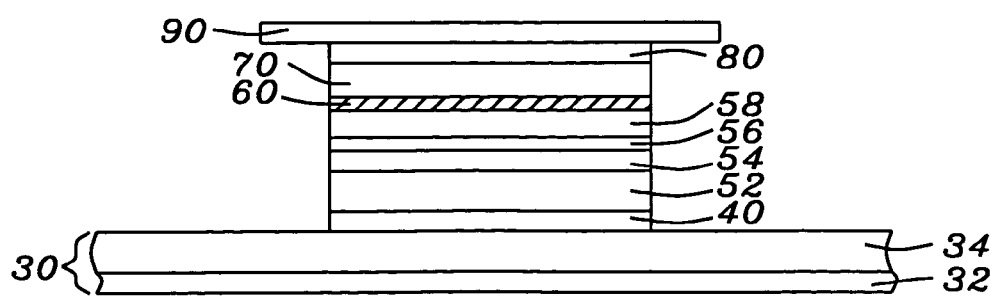

Referring to FIG. 3, there is shown a schematic vertical cross-sectional view (in the xz-plane) of the configuration of FIG. 2. The xy-plane will also be referred to as the horizontal plane. The MTJ cell (10), of circular or low aspect ratio elliptical cross-section in the xy-plane, is formed between orthogonal write word (20) and bit (30) lines, both of which extend horizontally in the xy-plane but are separated vertically in the z-direction, in accord with the method of the present invention. In the figure, the write word line (20) comes out of the plane of the figure, in the y-direction indicated in FIG. 1. The bit line is a composite layer which includes a thin adjacent soft (low coercivity) magnetic layer (32) of high permeability, the SAL, and a conducting layer portion (34), which carries the substantial portion of the bit line current. The bit line may be formed in a trench in a dielectric layer over a silicon substrate, but it may also be formed on other substrates. These details are not shown and are not necessary to explain the preferred embodiment. The conducting portion (34) of the bit line is formed of a non-magnetic high conductivity material, such as Cu, Au, Al, Ag, CuAg, Ta, Cr, NiCr, NiFeCr, Ru, Rh and their multi-layers and alloys. The conducting portion separates the SAL from the free layer of the cell and must be as thin as possible, less than 1000 angstroms, for optimal coupling between the SAL and the free layer. In addition, the width of the bit line should be greater than the lateral dimension of the cell. The SAL is formed of soft magnetic material (low coercivity) such as alloys of Co, Ni and Fe and has a thickness between approximately 50 and 500 angstroms, which should be larger than the thickness of the free layer. A seed layer (40) is formed on the bit line and promotes the high quality formation of subsequently formed layers of the cell. The seed layer can be a layer of NiCr or NiFe formed to a thickness between approximately 25 and 100 angstroms. A single pinned layer or, as in this embodiment, synthetic ferrimagnetic pinned layer (50) is formed on the seed layer. The synthetic layer includes an antiferromagnetic pinning layer (52), a first ferromagnetic layer (54), a coupling layer (56) and a second ferromagnetic layer (58). The antiferromagnetic layer pins the magnetization of the first ferromagnetic layer unidirectionally through a magnetic annealing process and the second ferromagnetic layer is magnetized in an antiparallel direction to that of the first layer. The first and second ferromagnetic layers are layers of CoFe, CoFeB, CoNiFe or NiFe formed to thicknesses between approximately 10 and 200 angstroms and matched so that the net magnetic moment of the configuration is substantially zero. The coupling layer is a layer of Rh, Ru, Cr or Cu of proper thickness to maintain strong antiparallel coupling. The antiferromagnetic pinning layer (52) can be a layer of PtMn, NiMn, OsMn, IrMn, NiO or CoNiO of thickness between approximately 40 and 300 angstroms.

A tunneling barrier layer (60) is formed on the second ferromagnetic layer (56) of the pinned layer. This layer is a layer of insulating material such as oxidized Al or an oxidized Al—Hf bilayer or a layer of AlN and is formed to a thickness between approximately 7 to 15 angstroms. A ferromagnetic free layer (70) is formed on the barrier layer. At this stage of the cell fabrication, it is important to note that the vertical spacing between the SAL and the free layer should less than 1/5 the lateral dimension of the free layer. The free layer can be a single layer of ferromagnetic material, such as a layer of CoFe, CoFeB, CoNiFe or NiFe formed to a thickness between approximately 20 and 200 angstroms, or it can be a multilayer, comprising first and second ferromagnetic layers, magnetized in antiparallel directions and separated by a spacer layer of non magnetic but conducting material such as Rh, Ru, Cr or Cu, which is of the proper thickness to maintain strong antiparallel coupling between the two ferromagnetic layers. A capping layer (80) is formed on the free layer. The capping layer can be a layer of Ru, or Ta formed to a thickness between approximately 10 and 1000 angstroms, or it can be a layer of $Al_2O_3$, TaO or CrO formed to a thickness between approximately 2 and 8 angstroms. A read word line (90), formed of high conductivity material such as, Au, Al, Ag, CuAg, Ta, Cr, NiCr, NiFeCr, Ru, Rh and their multi-layers and alloys, is required for read operations on the cell and is formed on the capping layer After the deposition of the capping layer, the MRAM cell is patterned to produce a uniform horizontal cross-section which is circular or elliptical of low aspect ratio. As was already noted, if a small degree of magnetic shape anisotropy is required to enhance the magnetostatic coupling, the pattern can be made to produce a slightly elliptical shape. Alternatively, crystalline uniaxial magnetic anisotropy can be induced in the free layer of the cell during thermal annealing of the antiferromagnetic pinning layer.

A layer of insulating material (100) surrounds the cell and separates the upper portion of the cell from the write word line. Such insulation is necessary to isolate the cell from the write word line and for the isolation of individual cells formed within an array. It is noted that the word line is a layer of conducting material less than 100 nm in thickness and may be augmented with a cladding layer (44) of magnetic material formed on its surface away from the cell.

As is understood by a person skilled in the art, the preferred embodiment of the present invention is illustrative of the present invention rather than being limiting of the present invention. Revisions and modifications may be made to methods, processes, materials, structures, and dimensions through which is formed an MTJ MRAM cell or an MRAM array of such cells, having a composite bit line with an adjacent soft magnetic layer that magnetostatically couples to the cell free layer to make it thermally stable and easily switchable, while still providing such an MRAM cell or array of such cells, formed in accord with the present invention as defined by the appended claims.

What is claimed is:

1. A method of forming a thermally stable and easily switchable MTJ MRAM cell comprising:
    providing a substrate;
    forming a patterned composite bit line on said substrate, said bit line extending in a first direction in a horizontal plane and said bit line including a conducting layer and an adjacent soft magnetic layer (SAL);
    forming a multilayered magnetic tunnel junction (MTJ) element on said patterned bit line, said element including a magnetically pinned layer and a magnetically free layer which is vertically separated from said SAL by a vertical distance and is magnetostatically coupled to said SAL, said free layer acquiring, thereby, a magnetic interaction anisotropy;
    patterning said MTJ element to form a horizontal cross-sectional shape which has a horizontal dimension and is circular or elliptical with low aspect ratio less than 2;

annealing said MTJ element to pin said pinned layer to an adjacent antiferromagnetic pinning layer;

forming a write word line above said MTJ element, said write word line being in a horizontal plane and extending in a second direction which is perpendicular to said first direction and said write word line being electrically insulated from said MTJ element.

2. The method of claim 1 wherein the formation of said composite bit line comprises:

forming a layer of soft magnetic material (SAL);

forming a layer of non-magnetic, high conductivity material on said soft magnetic material, said high conductivity layer having a thickness and carrying substantially all current in said bit line and wherein the thickness of said layer of high conductivity material produces a vertical separation between said SAL and said free magnetic layer to allow a magnetostatic coupling therebetween.

3. The method of claim 1 wherein said layer of high conductivity material is a layer of Cu, Au, Al, Ag, CuAg, Ta, Cr, NiCr, NiFeCr, Ru, Rh or their multilayers and alloys and is formed to a thickness of less than 1000 angstroms.

4. The method of claim 1 wherein the layer of soft magnetic material is a layer of alloys of Co, Fe and Ni and is formed to a thickness that is greater than the thickness of said free layer.

5. The method of claim 1 wherein the ferromagnetic free layer is synthetic ferrimagnetic layer comprising ferromagnetic layers of substantially equal and opposite moments, separated by a coupling layer.

6. The method of claim 1 wherein the vertical distance between the SAL and the ferromagnetic free layer is less than $1/5$ of the horizontal dimension of the free layer.

7. The method of claim 1 wherein the width of the composite bit line is greater than the horizontal dimension of the MTJ element.

8. The method of claim 1 wherein the thickness of the composite bit line is less than 100 nm.

9. The method of claim 1 wherein magnetostatic coupling is enhanced by patterning said cell to form an elliptical horizontal cross-section of low aspect ratio with the major axis set in the bit line direction, said cross-sectional shape producing a shape anisotropy within the cell free layer.

10. The method of claim 1 wherein said magnetostatic coupling can be enhanced or reduced by inducing a properly directed uniaxial crystalline anisotropy in the cell free layer during the annealing of the cell.

* * * * *